United States Patent
Chen

(10) Patent No.: US 12,027,223 B2
(45) Date of Patent: Jul. 2, 2024

(54) METHOD, DEVICE, APPARATUS AND STORAGE MEDIUM FOR REPAIRING FAILED BITS

(71) Applicant: CHANGXIN MEMORY TECHNOLOGIES, INC., Hefei (CN)

(72) Inventor: Yui-Lang Chen, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 219 days.

(21) Appl. No.: 17/449,590

(22) Filed: Sep. 30, 2021

(65) Prior Publication Data

US 2022/0139490 A1 May 5, 2022

Related U.S. Application Data

(63) Continuation of application No. PCT/CN2021/108195, filed on Jul. 23, 2021.

(30) Foreign Application Priority Data

Nov. 5, 2020 (CN) .......................... 202011225125.6

(51) Int. Cl.
*G11C 29/44* (2006.01)
*G11C 29/00* (2006.01)
*G11C 29/12* (2006.01)

(52) U.S. Cl.
CPC ...... *G11C 29/4401* (2013.01); *G11C 29/1201* (2013.01); *G11C 29/785* (2013.01)

(58) Field of Classification Search
CPC .............. G11C 29/1201; G11C 29/785; G11C 29/4401
See application file for complete search history.

(56) References Cited

U.S. PATENT DOCUMENTS

| 4,047,163 A | * | 9/1977 | Choate | ................... | G11C 29/78 |
| | | | | | 365/201 |
| 10,628,265 B2 | * | 4/2020 | Kim | ....................... | G11C 29/42 |

(Continued)

FOREIGN PATENT DOCUMENTS

| CN | 101765889 A | 6/2010 |
| CN | 107437435 A | 12/2017 |

(Continued)

OTHER PUBLICATIONS

Wang Fan, Repair method of non uniformly distributed redundant DRAM, Science and Technology & Innovation, No. 9, (2017), 2095-6835 (2017) 09-0130-02.

(Continued)

*Primary Examiner* — Tuan T Nguyen
(74) *Attorney, Agent, or Firm* — SYNCODA LLC; Feng Ma

(57) ABSTRACT

A method for repairing a failed bit includes: acquiring a repair specification of redundancy of a chip where the failed bit is located; standardizing the repair specification of the redundancy to obtain a standardized repair specification; acquiring the position of the failed bit on the chip; processing the position of the failed bit on the chip according to the standardized repair specification to obtain standardized position of the failed bit; allocating the redundancy by the redundancy allocation algorithm according to the standardized position of the failed bit and the standardized repair specification to obtain standardized repair position of the redundancy; and restoring the standardized repair position of the redundancy to the repair a position of the redundancy on the chip according to the standardized repair specification to repair the failed bit.

17 Claims, 9 Drawing Sheets

(56) References Cited

U.S. PATENT DOCUMENTS

| | | | |
|---|---|---|---|
| 11,334,423 B2* | 5/2022 | Park | G11C 29/787 |
| 11,450,401 B2* | 9/2022 | Chiang | G11C 29/24 |
| 2006/0179368 A1* | 8/2006 | Chang | G11C 29/44 |
| | | | 714/718 |
| 2007/0220379 A1* | 9/2007 | Buck-Gengler | G11C 29/72 |
| | | | 714/718 |
| 2010/0169705 A1 | 7/2010 | Fujii | |
| 2011/0113280 A1* | 5/2011 | Chickanosky | G11C 29/76 |
| | | | 714/E11.169 |
| 2014/0157065 A1* | 6/2014 | Ong | G11C 29/12 |
| | | | 714/718 |
| 2015/0255175 A1* | 9/2015 | Hyder | G11C 29/4401 |
| | | | 714/719 |
| 2020/0035322 A1* | 1/2020 | Shalom | G11C 29/76 |
| 2020/0097842 A1 | 3/2020 | Jones et al. | |

FOREIGN PATENT DOCUMENTS

| | | |
|---|---|---|
| CN | 110879931 A | 3/2020 |
| CN | 111415700 A | 7/2020 |

OTHER PUBLICATIONS

Yu Yongjian, et,al. Application of Collaborative Analysis in Failure Location of Integrated Circuits, Electronics & Packaging, vol. 17, No. 8, Aug. 2017.

* cited by examiner

Original local segment 6002

Standardized local segment 6004

Failed bit in the original local segment

Allocating 1 LR repair in the original local segment (this counts as 1)

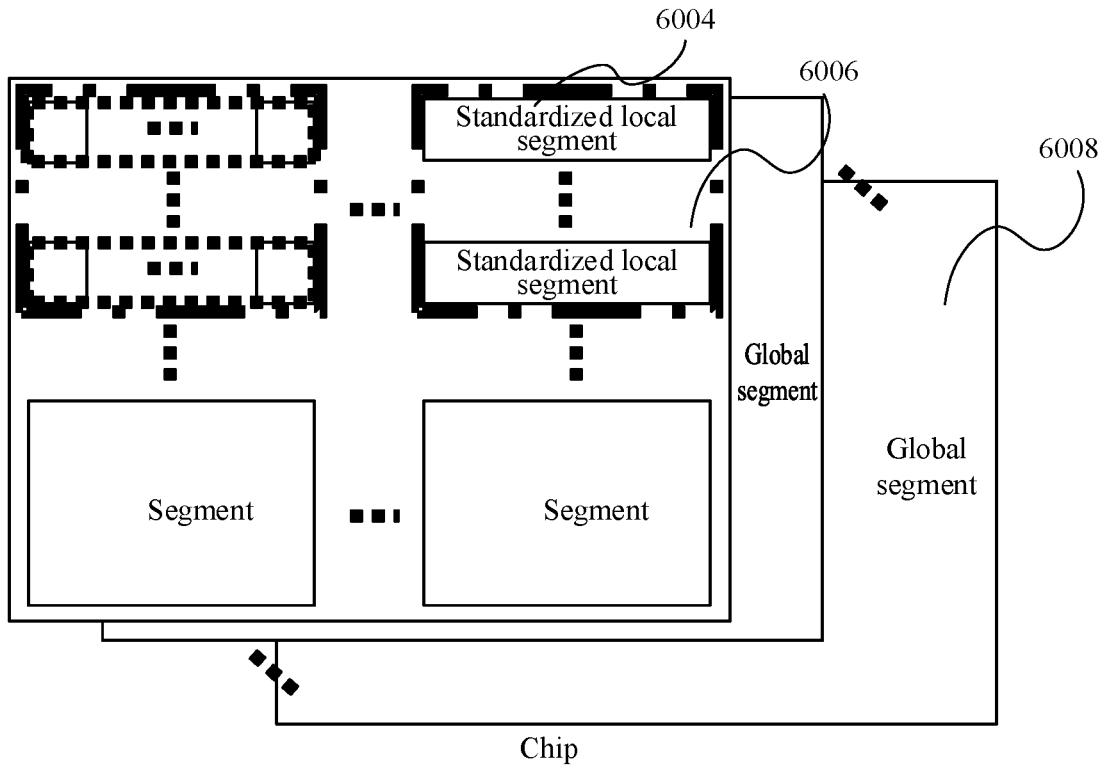

FIG. 7

| S802 |
|---|
| Allocating the redundancy by the redundancy allocation algorithm according to the positions of the failed bits in the respective unified segments and the standardized repair range, to obtain the standardized repair position as the repair positions of the redundancy in the respective unified segments |

| S804 |
|---|
| Restoring the repair positions on the redundancy in the respective unified segments to the repair positions of the redundancy on the chip according to the standardized line width to repair the failed bits |

FIG. 8

METHOD, DEVICE, APPARATUS AND STORAGE MEDIUM FOR REPAIRING FAILED BITS

CROSS-REFERENCE TO RELATED APPLICATIONS

This is a continuation of International Patent Application No. PCT/CN2021/108195 filed on Jul. 23, 2021, which claims priority to Chinese Patent Application No. 202011225125.6 filed on Nov. 5, 2020. The disclosures of these applications are hereby incorporated by reference in their entirety.

BACKGROUND

With the rapid development of computer technology, integrated circuit chips are playing an increasing role in people's production and life. However, the failure of the chip during the development, production and use process is inevitable, and a redundancy can usually be used to repair the failed bits in the chip.

The above information disclosed in the background section is only used to enhance the understanding of the background of the present disclosure, and therefore, it may include information that does not constitute the prior art known to those skilled in the art.

SUMMARY

The present disclosure relates to the field of semiconductor technology, and in particular, to a method, device, apparatus, and readable storage medium for repairing failed bits.

According to some embodiments, the first aspect of the present disclosure provides a method for repairing a failed bit, which includes: acquiring a repair specification of redundancy of a chip where the failed bit is located; standardizing the repair specification of the redundancy to obtain a standardized repair specification; acquiring the position of the failed bit on the chip; processing the position of the failed bit on the chip according to the standardized repair specification to obtain standardized position of the failed bit; allocating the redundancy by the redundancy allocation algorithm according to the standardized position of the failed bit and the standardized repair specification to obtain a standardized repair position of the redundancy; and restoring the standardized repair position of the redundancy to the repair position of the redundancy on the chip according to the standardized repair specification to repair the failed bit.

According to some embodiments, the second aspect of the present disclosure provides a device for repairing a failed bit, which includes: a parameter acquisition module, configured to acquire a repair specification of a redundancy of the chip where the failed bit is located, and acquire the position of the failed bit on the chip; a specification conversion module, configured to standardize the repair specification of the redundancy to obtain a standardized repair specification, and process the position of the failed bit on the chip according to the standardized repair specification to obtain standardized position of the failed bit; a circuit allocation module, configured to allocate the redundancy by a redundancy allocation algorithm according to the standardized position of the failed bit and the standardized repair specification to obtain a standardized repair position of the redundancy; and a position restoration module, configured to restore the standardized repair position of the redundancy to the repair position of the redundancy on the chip according to the standardized repair specification to repair the failed bit.

According to some embodiments, the third aspect of the present disclosure provides an apparatus, which includes: a memory, a processor and executable instructions stored in the memory and executable in the processor, wherein the processor implements any one of the above methods when executing the executable instructions.

According to some embodiments, the fourth aspect of the present disclosure provides a computer-readable storage medium having stored thereon computer executable instructions that when executed by a processor, implements any one of the above methods.

It is to be understood that the details of one or more embodiments of the present disclosure are set forth in the following drawings and descriptions, the above general description and the following detailed descriptions are only exemplary, and cannot limit the present disclosure. Other features and advantages of the present disclosure will become apparent from the description, drawings, and claims.

BRIEF DESCRIPTION OF THE DRAWINGS

In order to more clearly describe the technical solutions in the embodiments of the present disclosure or the traditional technology, the following will briefly introduce the drawings that need to be used in the embodiments. Obviously, the drawings in the following description are only some embodiments of the present disclosure. For those skilled in the art, other drawings can be obtained according to these drawings without any creative effort. By describing its exemplary embodiments in detail with reference to the accompanying drawings, the above and other objectives, features, and advantages of the present disclosure will become more apparent.

FIG. 7 illustrates a schematic diagram of a unified specification data according to an exemplary embodiment.

FIG. 8 illustrates a flow chart of another method for repairing failed bits according to an exemplary embodiment.

DETAILED DESCRIPTION

Figure 1:
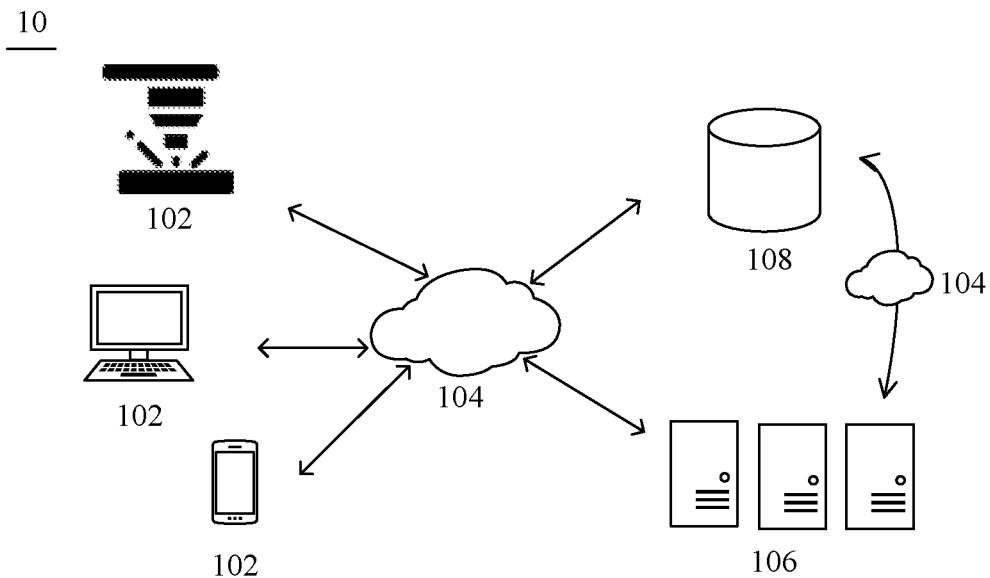
FIG. 1 illustrates a schematic diagram of a system structure in an embodiment of the present disclosure.

Exemplary embodiments will now be described more fully with reference to the accompanying drawings. However, the exemplary embodiments can be implemented in various forms, and should not be construed as being limited to the examples set forth herein; on the contrary, the provision of these embodiments makes the present disclosure more comprehensive and complete, and fully conveys the concept of the exemplary embodiments to those skilled in the art. The drawings are only schematic illustrations of the present disclosure, and are not necessarily drawn to scale. The same reference numerals in the drawings denote the same or similar parts, and thus their repeated description will be omitted.

In addition, the described features, structures or characteristics may be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, devices, steps, etc. can be adopted. In other cases, well-known structures, methods, devices, implementations or operations are not illustrated or described in detail in order to avoid obscuring all aspects of the present disclosure.

Additionally, the terms "first", "second", etc. are only used for describing objective, and cannot be understood as indicating or implying relative importance or implicitly indicating the number of indicated technical features. Thus, the features defined with "first" and "second" may explicitly or implicitly include one or more of these features. In the description of the present disclosure, "plurality" means at least two, such as two, three, etc., unless otherwise specifically defined. The symbol "I" generally indicates that the associated objects before and after are in an "or" relationship.

In the present disclosure, unless otherwise clearly specified and defined, terms such as "connection" should be interpreted broadly, for example, it may be electrical connection or mutual communication; it may be directly connected or indirectly connected through an intermediary. For those skilled in the art, the specific meaning of the above terms in the present disclosure can be understood according to specific circumstances.

Repair Algorithm (RA) is a method that can effectively allocate redundancies to repair the circuits where the above failed bits are located. RA can acquire the positions allocated for the redundancy, and the positions in these positions that may cover all the failed bits on the chip are replaced with a high probability. However, the higher the probability that an RA allocation position covers all the failed bits on a specific chip, the more difficult it is for this RA to be applied to chips of different product specifications, and it takes a long time and high cost to re-develop the RA for chips with different product specifications. Therefore, the improvement on the generality of RA has become an urgent problem to be resolved.

As described above, the chip containing the failed bit is provided with a redundancy, the chip includes a redundancy extending in a predetermined direction, and the redundancy is used to repair the chip by replacing the failed bit in the preset repair range. The number of redundancies is limited, so it is necessary to design RA to allocate redundancies. RA can acquire the positions allocated for various redundancies, which are replaced by positions with high probability that may cover all failed bits on the chip. However, the higher the probability that an RA allocation position covers all of the failed bits, the more difficult it is for this RA to become a general algorithm. General algorithm means that it can be easily applied to most (or even all) product specifications. However, RA development takes a long time and is costly. Therefore, the improvement on the generality of RA has become an urgent problem to be resolved.

Therefore, the present disclosure provides a method for repairing failed bits, wherein, by obtaining the repair specification of the redundancy of the chip where the failed bits are located and the positions of the failed bits on the chip, the repair specification of the redundancy is standardized to obtain the standardized repair specification, and according to the standardized repair specification, the positions of the failed bits on the chip are processed to obtain the standardized positions of the failed bits, and then the redundancy is allocated by the redundancy allocation algorithm according to the standardized positions of the failed bits and the standardized repair specification to obtain the standardized repair position of the redundancy, and then the standardized repair positions of the redundancy are restored to the repair positions of the redundancy on the chip according to the standardized repair specification to repair the failed bits, so that the generality of the repair algorithm can be improved.

FIG. 1 illustrates an exemplary system architecture 10 to which the method for repairing failed bits or the redundancy analysis system of the present disclosure can be applied.

As illustrated in FIG. 1, the system architecture 10 may include a terminal apparatus 102, a network 104, a server 106, and a database 108. The terminal apparatus 102 may be various electronic apparatus that have a display screen and support input and output, including but not limited to smart phones, tablet computers, laptop computers, desktop computers, chip repair apparatuses, and so on. The network 104 is used as a medium for providing a communication link between the terminal apparatus 102 and the server 106. The network 104 may include various connection types, such as wired, wireless communication links, or fiber optic cables, and so on. The server 106 may be a server or a server cluster that provides various services. The database 108 may be a large-scale database software placed on a server, or a small-scale database software installed on a computer for storing data.

The terminal apparatus 102 can be used to interact with the server 106 and the database 108 through the network 104 to receive or send data and so on. For example, the terminal apparatus 102 may be a chip repair apparatus, which uploads chip failed bit position data and redundancy repair specifications to the server 106 via the network 104, and obtains the allocated redundancy repair position from the server 106 via the network 104. The server 106 may also receive data from the database 108 or send data to the database 108 via the network 104. For example, the server 106 may be a background processing server, which is used to acquire failed bit position data of the bit and redundancy repair specifications from the database 108 via the network 104, allocate redundancy, and then feed back the allocated redundancy repair position to the chip repair apparatus 102 via the network 104.

It is to be understood that the numbers of terminal apparatuses, networks, servers, and databases in FIG. 1 are merely illustrative. According to implementation requirements, there can be any number of terminal apparatuses, networks, servers, and databases.

Figure 2:
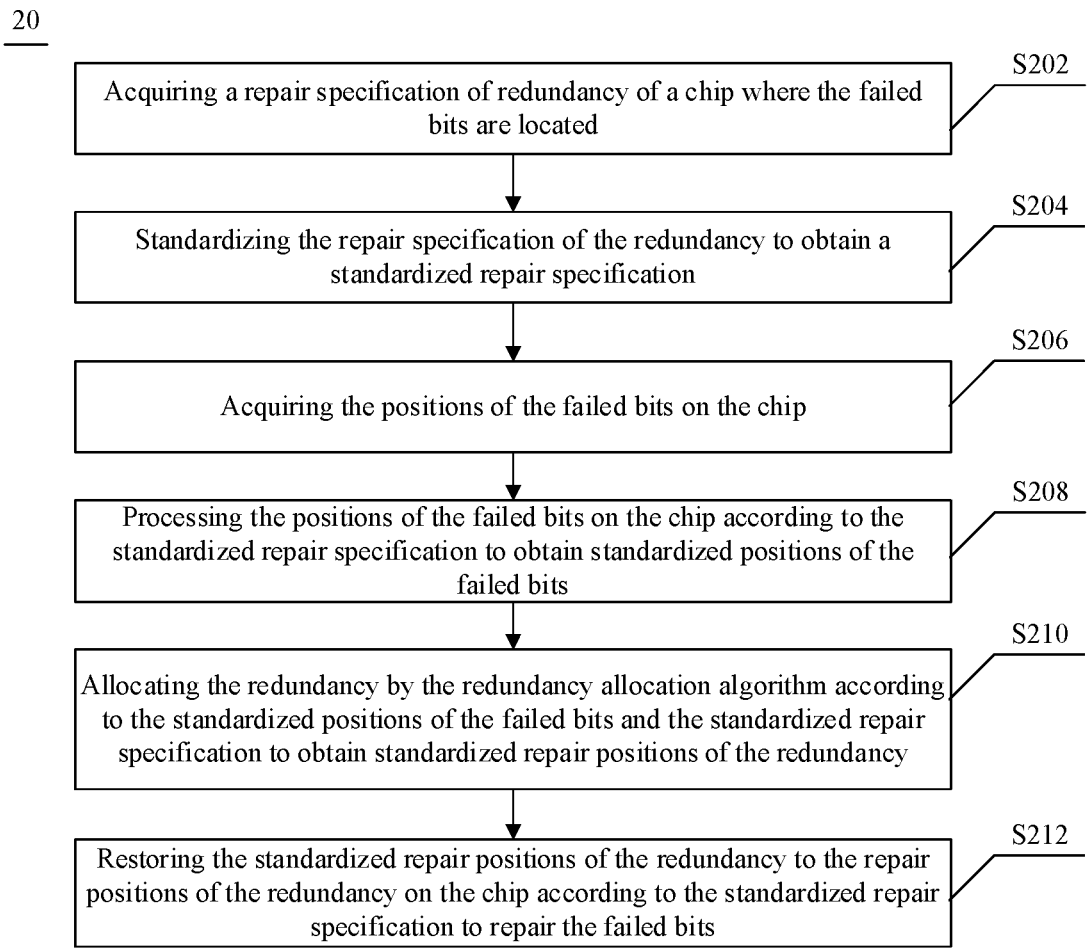
FIG. 2 illustrates a flow chart of a method for repairing failed bits in an embodiment of the present disclosure.

FIG. 2 illustrates a flow chart of a method for repairing failed bits according to an exemplary embodiment. The method illustrated in FIG. 2, for example, can be applied to the server side of the above system, and can also be applied to the terminal apparatus of the above system.

With reference to FIG. 2, the method 20 provided by the embodiments of the present disclosure may include the following steps.

In Step S202, a repair specification of redundancy of a chip where the failed bits are located is acquired. The repair specification of the redundancy may include the line width of the redundancy and the preset repair range of the redundancy, and may also include the number of the redundancy, and so on. Different chip products can have different redundancy repair specifications.

In Step S204, the repair specification of the redundancy is standardized to obtain a standardized repair specification. The standardized repair specification can include a standardized line width and a standardized repair range. The line width of the redundancy can be standardized according to the number of bits, and the repair range can be re-divided according to the length and number of the redundancies and other parameters to obtain the standardized repair range. For the implementation, reference may be made to FIGS. 5A to 5B. By standardizing the repair specifications of the redundancies, the repair specifications of the redundancies of various products are converted into a unified standard specification, which can be used in the subsequent redundancy allocation algorithm.

In Step S206, a position of the failed bit on the chip is acquired. The position data of all of the failed bits in a chip can be obtained. Different chip products have different ways of arranging positions. It is usually counted in multiples of 2 on the chip. For example, a certain chip product is composed of $2^2$ bank groups (BG), and each BG is divided into $2^2$ banks. The position of the bit position in the Bank can be X15-0, D0-2, Y0-3 . . . and other 2 metadata components. In other words, the position of a bit in a chip can be represented by 32 binary values.

In Step S208, the positions of the failed bits on the chip are processed according to the standardized repair specification to obtain standardized positions of the failed bits. The positions of the failed bits on the chip are scaled according to the line width and the standardized line width of the redundancy to obtain the standardized positions of the failed bits.

In some embodiments, for example, the available scaling parameter is the standardized line width/the original line width of the redundancy.

In Step S210, the redundancy is allocated by the redundancy allocation algorithm according to the standardized position and the standardized repair specification of the failed bit to obtain standardized repair positions of the redundancy. According to the standardized line width of the redundancy, the standardized repair range and the number of redundancies, any algorithm that can effectively allocate the redundancy to completely cover all of the failed bit positions on the chip can be used to allocate the redundancy and obtain the standardized repair position of the redundancy for the standardized repair range.

In Step S212, the standardized repair positions of the redundancy are restored to the repair positions of the redundancy on the chip to repair the failed bits according to the standardized repair specification. The standardized repair position of the redundancy can be restored to the repair positions of the redundancy on the chip according to the line width and the standardized line width of the redundancy to repair the failed bits. For example, the repair positions of the redundancy on the chip can be reversely restored according to the above scaling parameter, and the data can be provided to the chip repair apparatus for repair.

In the method for repairing failed bits provided by the embodiments of the present disclosure, by obtaining the repair specification of the redundancy of the chip where the failed bits are located and the positions of the failed bits on the chip, the repair specification of the redundancy is standardized to obtain the standardized repair specification, and according to the standardized repair specification, the positions of the failed bits on the chip are processed to obtain the standardized position of the failed bit, and then the redundancy is allocated by the redundancy allocation algorithm according to the standardized positions of the failed bits and the standardized repair specification to obtain the standardized repair position of the redundancy, and then the standardized repair positions of the redundancy are restored to the repair position of the redundancy on the chip according to the standardized repair specification to repair the failed bit, so that the generality of the repair algorithm can be improved.

Figure 3:
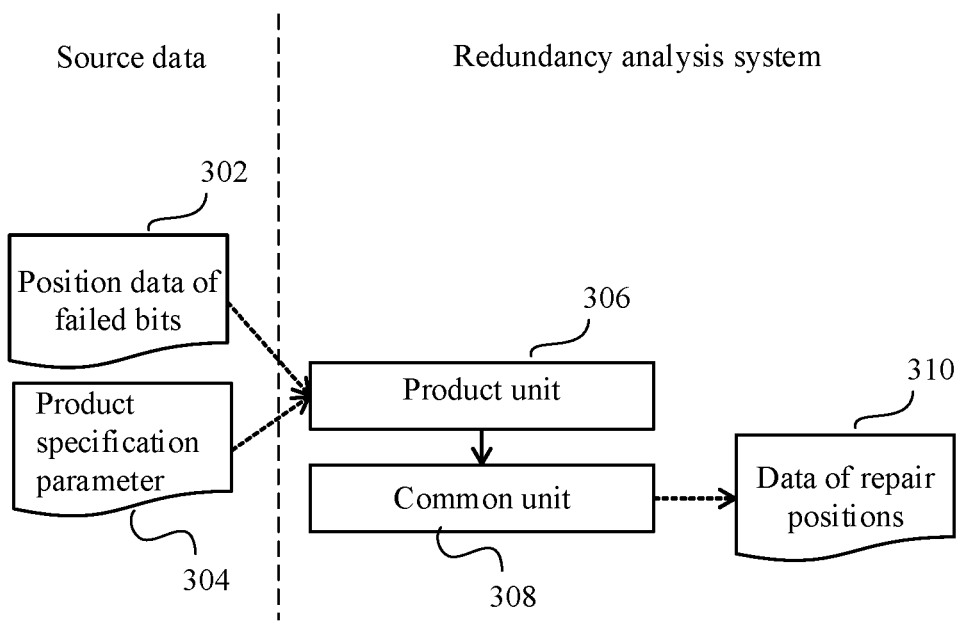
FIG. 3 illustrates a schematic diagram of data flow of a redundancy analysis system illustrated in FIG. 2.

FIG. 3 illustrates a schematic diagram of data flow of a redundancy analysis system illustrated in FIG. 2. As illustrated in FIG. 3, the source data input to the redundancy analysis system includes the position data 302 of the failed bit on the original chip and the product specification parameter 304. The product specification parameter 304 may be the repair specification of the redundancy. In FIG. 3, the solid-line connected arrows indicate the processing procedure, and the dashed-line connected arrows indicate input/output. The redundancy analysis system may include a product unit 306 and a common unit 308, as described in detail below.

The product unit 306 can standardize specifications for a variety of different product specifications, configure a conversion method and specification definition of a unified specification data, so that any product specification (such as new product specification) data can convert the new product specification into unified specification data through the standardization method of product specification parameters. The product unit 306 can be used to implement Step S202 to Step S208 in FIG. 2.

The common unit 308 can embed any redundancy allocation algorithm, so that various redundancy allocation algorithms can take over the flow of the unified specification data, and control the unified specification data to perform algorithm calculations to acquire the final redundancy allocation repair position data 310. The repair position data 310 can allocate the position data for repairing failed bits for all of the redundancies in a chip. The product unit 306 can be used to implement Step S210 to Step S212 in FIG. 2.

Figure 4A:
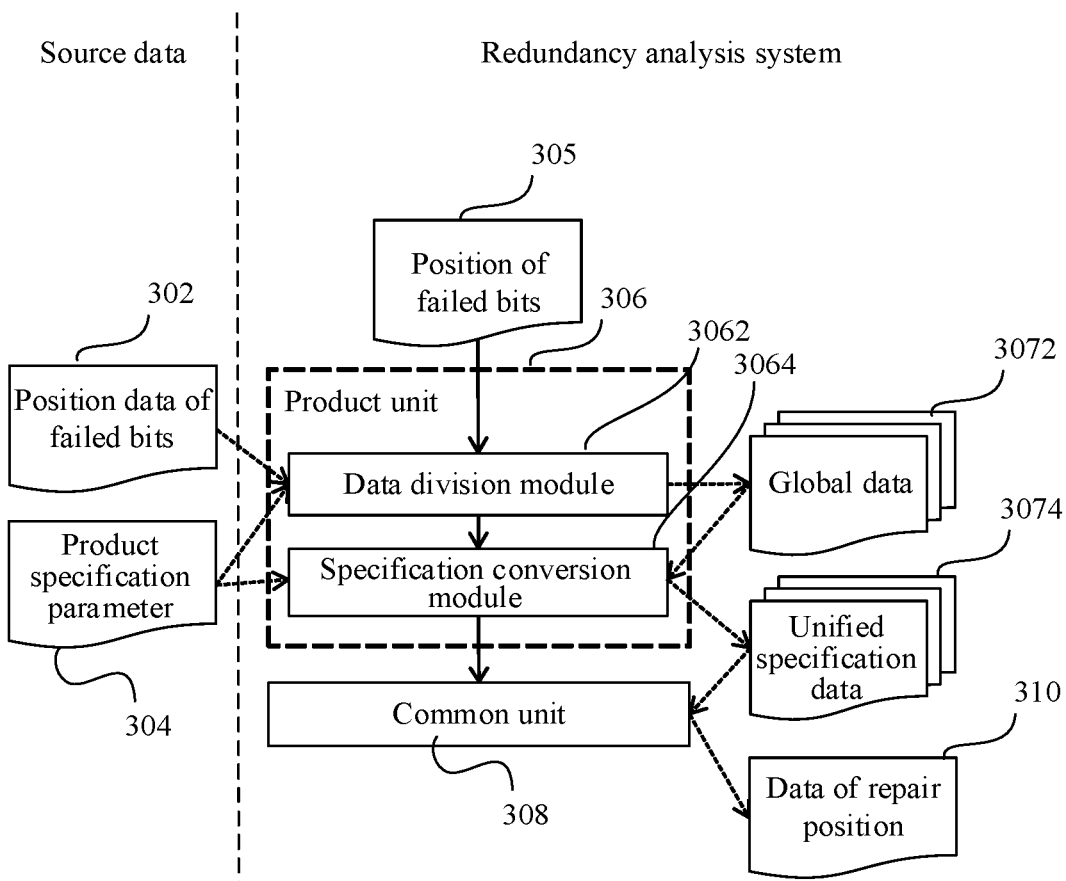
FIG. 4A illustrates a block diagram of a product unit illustrated in FIG. 3.

FIG. 4A illustrates a data interaction diagram of data division using the redundancy analysis system illustrated in FIG. 3. In FIG. 4A, the solid-line connected arrows indicate the processing procedure, and the dashed-line connected arrows indicate input/output. As illustrated in FIG. 4A, the product unit 306 may include a data division module 3062 and a specification conversion module 3064, which are described in detail as follows.

Figure 4B:
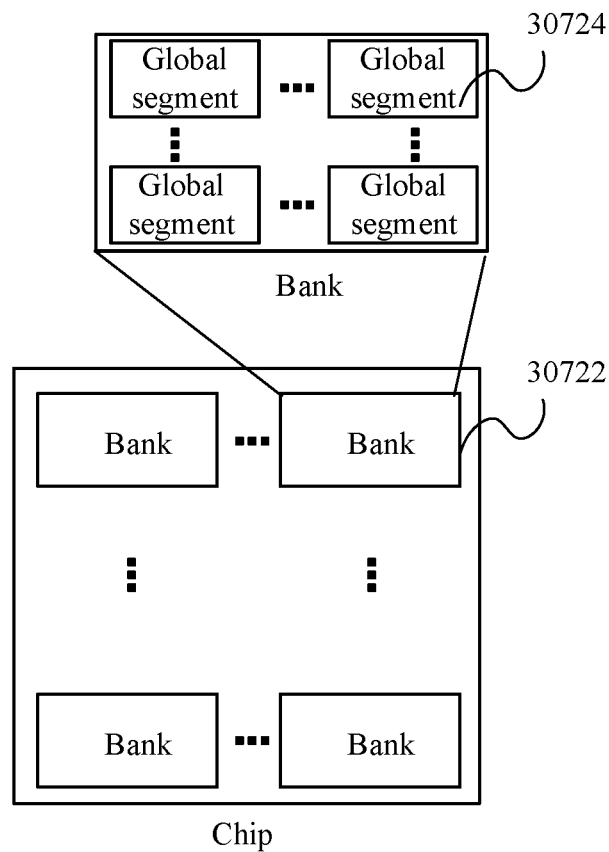
FIG. 4B illustrates a schematic diagram of data division using a redundancy analysis system according to an exemplary embodiment.

The data division module 3062 can be used to divide the data of a chip into several independently processable range data that will not affect each other when the redundancy is allocated. The data division module 3062 can divide the data in the chip according to the product specification parameter 304. FIG. 4B illustrates a schematic diagram of a data division according to an exemplary embodiment. As illustrated in FIG. 4B, the data in a chip is divided into several Banks 30722 data. Each bank data is divided into a number of global segments 30724 based on the maximum range that can be allocated by the Global Redundancy (GR) in the product specifications (this range is called as the global segment), and stored as global data 3072. The global data 3072 can be sent to the specification conversion module 3064.

The specification conversion module 3064 can be used to convert the global data 3072 into unified specification data 3074 and transmit it to the common unit 308 without affecting the known failed bit position information. In addition, the data provides the scaling parameters of all of the bit positions before and after standardization, so that the original position can be calculated for each of the standardized positions. For the specific processing procedure of the specification conversion module 3064, With reference to FIGS. 5A to 6C.

The common unit 308 provides an algorithm of the redundancy allocation, which specifies the redundancy that is used to repair each of the failed bits without providing different algorithms for a certain product, provides a unified specification data 3074 that can divide a large number of data that has been divided to achieve an orderly processing procedure, and acquires the final redundancy allocation repair position data 310.

Figure 5A:
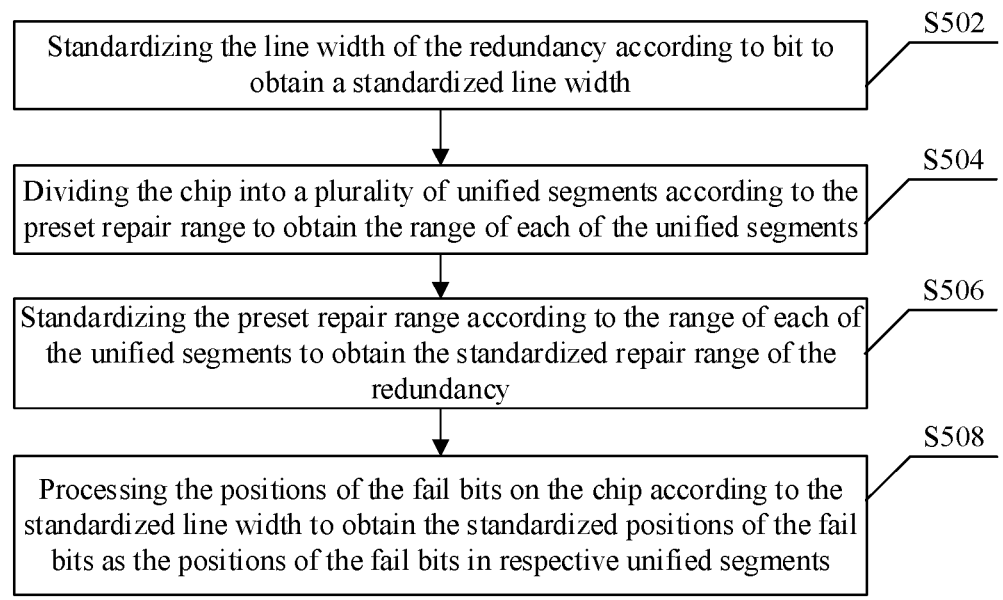
FIG. 5A illustrates a flow chart of a specification conversion method of a redundancy according to an exemplary embodiment.

FIG. 5A illustrates a flow chart of a specification conversion method of a redundancy according to an exemplary embodiment. The method illustrated in FIG. 5A may be a specific processing procedure from Step S204 to Step S208 in FIG. 2. The method illustrated in FIG. 5A, for example, can be applied to the server side of the above system, and can also be applied to the terminal apparatus of the above system.

In Step S502, the line width of the redundancy is standardized according to bit to so as obtain a standardized line width. In response to the problem of different line widths of various redundancies in various products, the line width of the redundancy can be standardized according to the bit, for example, standardized to 1, or 2, or 3 bits.

In Step S504, the chip is divided into a plurality of unified segments according to the preset repair range to obtain the range of each of the unified segments. The length of the range of each of the unified segments can be obtained as a length of the corresponding preset repair range in the extension direction of the redundancy, or the width of the range of each of the unified segments can be obtained as a length of the corresponding preset repair range in the extension direction of the redundancy.

In some embodiments, for example, the redundancy comprises a Global Redundancy (GR) and a Local Redundancy (LR), the extension direction of the global redundancy is orthogonal to the extension direction of the local redundancy, the preset repair range comprises a global repair range and a local repair range, and the global repair range comprises a plurality of the local repair ranges, wherein the global redundancy is configured to repair the failed bits in the global repair range on the chip, and the local redundancy is configured to repair the failed bits in the local repair range on the chip. the length of the range of each of the unified segments is obtained as the length of the corresponding global repair range in the extension direction of the global redundancy, and the width of the range of each of the unified segments is obtained the same as the length in the corresponding local repair range in the extension direction of the local redundancy.

Figure 5B:
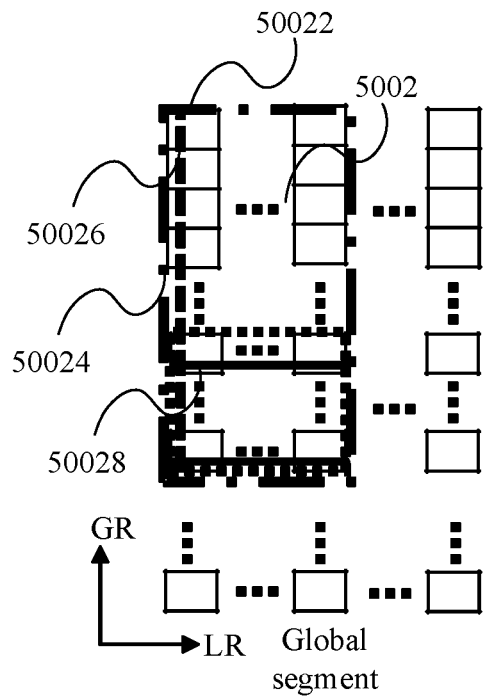
FIG. 5B illustrates a schematic diagram of a segment division according to an exemplary embodiment.

FIG. 5B illustrates a schematic diagram of a segment division according to an exemplary embodiment. As illustrated in FIG. 5B, after the chip is divided into a plurality of global segments according to FIG. 4B, each of the global segments can be divided into several segments 5002, and the GR and LR allocation processing procedures of any segment will not affect other segments, for example, the GR or LR allocated by A cannot overlap or overlap with the position of the GR or LR allocated by other segments except A. The range of a segment 5002 can be defined as: GR extension direction range is a length range 50024 of a GR that can be repaired, LR extension direction range is a length range 50022 of a LR that can be repaired, wherein the GR allocation repair example 50026 is the dashed-line in the GR direction in FIG. 5B, and the LR allocation repair example 50028 is the solid-line in the LR direction in FIG. 5B.

In Step S506, the preset repair range is standardized according to the range in each of the unified segments to obtain the standardized repair range of the redundancy. The chip or a global segment is divided into the range in each of the unified segments, and the repair range of the redundancy is corresponded to the range in each of the unified segments. For example, the standardized repair range corresponding to each GR or LR can be obtained.

In Step S508, the positions of the failed bits on the chip are processed according to the standardized line width to obtain the standardized positions of the failed bits as the positions of the failed bits in the corresponding unified segment. The position of each bit on the chip can be standardized to its position on a unified segment, and a bit value matrix can be used to indicate whether the bit of the position on the chip or segment is failed. When performing the calculation of the redundancy allocation, the line width can be standardized in the manner of the OR operation. For example, the line width is 3 bits, that is, the values of the first bit, the second bit and the third bit are subjected to the OR operation, that is, the standardized bit value=the first bit value or the second bit value or the third bit value.

In some embodiments, for example, GR is used to replace the word line where the failed bits are located, that is, GR=RWL (Redundant Word Line), and LR is used to replace the bit line where the failed bits are located, that is, LR=RBL (Redundant Bit Line). For example, the RWL line width is 2 (bits), the RBL line width is also 2, and the original local segment is $$\begin{bmatrix} 0 & 0 & 1 & 0 \\ 1 & 1 & 0 & 0 \\ 0 & 1 & 0 & 0 \\ 0 & 0 & 0 & 1 \end{bmatrix}$$

and then the GR line width can be standardized as $$\begin{bmatrix} 0 & 0 & 1 & 0 \\ 1 & 1 & 0 & 0 \\ 0 & 1 & 0 & 0 \\ 0 & 0 & 0 & 1 \end{bmatrix} = \begin{bmatrix} (0 \text{ or } 0) & (1 \text{ or } 0) \\ (1 \text{ or } 1) & (0 \text{ or } 0) \\ (0 \text{ or } 1) & (0 \text{ or } 0) \\ (0 \text{ or } 0) & (0 \text{ or } 1) \end{bmatrix} = \begin{bmatrix} 0 & 1 \\ 1 & 0 \\ 0 & 0 \\ 0 & 0 \end{bmatrix}$$

In other embodiments, the chip partitions may be refined. For example, a chip may be divided into a plurality of banks, the length of GR and LR will not exceed the range of 1 bank, and the length of GR is greater than the length of LR. Each bank is divided into a plurality of global segments, each of the global segments is divided into a plurality of segments, each of the segments can be divided into a plurality of local segments, and can also be divided into a plurality of sections, 1 local segment or section=a plurality of data sections (or data grids, DQ), 1DQ=a plurality of bits. In a chip, the size of the bank and the global segment will be the same, whereas the segment, local segment, and DQ may have different sizes.

According to the specification conversion method of the redundancy provided by the embodiments of the present disclosure, by converting the redundancy repair specifications of various products into a unified standard specification, the standardized repair data of products with different redundancy repair specifications are obtained, wherein various products will have different processing procedures, which can make the final output standardized repair data meet the requirements of the input specifications of the common unit, so that the redundancy with the standardized repair specification can be allocated by any circuit allocation algorithm in the common unit, and improve the repair calculation, thereby improving the generality of the repair algorithm.

Figure 6A:
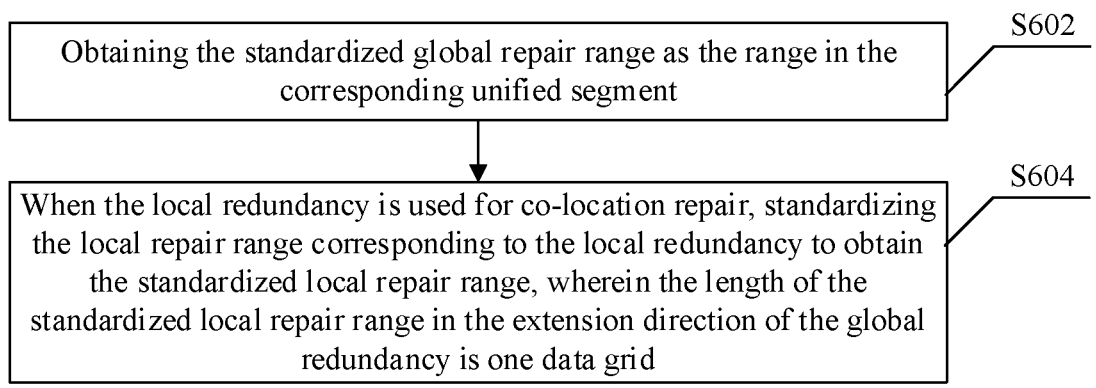
FIG. 6A illustrates a flow chart of another specification conversion method of a redundancy according to an exemplary embodiment.

FIG. 6A illustrates a flow chart of another specification conversion method of a redundancy according to an exemplary embodiment. The method illustrated in FIG. 6A may be the specific processing procedure of Step S506 in FIG. 6A. The method illustrated in FIG. 6A, for example, can be applied to the server side of the above system, and can also be applied to the terminal apparatus of the above system.

The standardized repair range includes a standardized global repair range and a standardized local repair range.

In Step S602, the standardized global repair range is obtained as the range in the corresponding unified segment.

In Step S604, when the local redundancy is used for co-location repair, the local repair range corresponding to the local redundancy is standardized to obtain the standardized local repair range, wherein the length of the standardized local repair range in the extension direction of the global redundancy is one data grid.

In some embodiments, for example, the LR line width can be standardized as $$\begin{bmatrix} 0 & 1 \\ 1 & 0 \\ 0 & 0 \\ 0 & 0 \end{bmatrix} = \begin{bmatrix} (0 \text{ or } 1) & (1 \text{ or } 0) \\ (0 \text{ or } 0) & (0 \text{ or } 0) \end{bmatrix} \begin{bmatrix} 1 & 1 \\ 0 & 0 \end{bmatrix}$$

this is the standardized local segment. The vertical axis uses DQ as the basic unit for OR operation or addition operation. For example, if the vertical DQ in each original local segment is regarded as a matrix, $$\tilde{d}_{jk} = \min(\Sigma_i d_{ijk}, 1) \quad (1)$$

where $d_{ijk}$ represents the value of the k-th bit in the i-th row and j-th column DQ in the original local segment, and $\tilde{d}_{jk}$ represents the value of the k-th bit in the j-th column DQ in the standardized local segment, as described above, the value of the bit is 0 or 1.

Figure 6B:
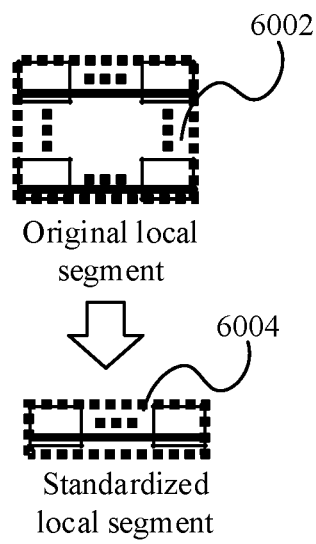
FIG. 6B illustrates a schematic diagram of a standardized local division according to an exemplary embodiment.

FIG. 6B illustrates a schematic diagram of a standardized local segment division according to an exemplary embodiment. As illustrated in FIG. 6B, if the LR has the feature of repairing the same position in the continuous DQ in the GR direction, the original local segment 6002 is standardized to obtain the standardized local segment 6004, that is, the range of the original local segment 6002 is standardized to be an acceptable minimum range in the GR direction, usually 1 DQ, so that the unified specification data can be used without considering the problem of co-location repair.

Figure 6C:
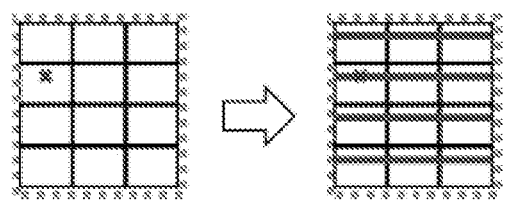
FIG. 6C illustrates a schematic diagram of a co-location repair according to an exemplary embodiment.

FIG. 6C illustrates a schematic diagram of a co-location repair according to an exemplary embodiment. As illustrated in FIG. 6C, in the case of no unified specification data, the left picture shows a bit of failed bits in the original local segment, and the right picture shows the LR repair circuit allocated in the LR direction. An LR is not a plurality of redundancies but just a redundancy, which looks like multiple (or rows) are the reason behind the circuit design, and they are all considered the same. When repairing, only a certain LR position is designated to replace the original line position with the failed bit, to achieve the purpose of repairing the failed bit.

FIG. 7 illustrates a schematic diagram of a unified specification data according to an exemplary embodiment. As illustrated in FIG. 7, a chip may include a plurality of global segments 6008, one global segment 6008 can be divided into a plurality of segments 6006, and a segment 6006 can be divided into a plurality of standardized local segments 6004 in the GR direction.

FIG. 8 illustrates a flow chart of another method for repairing failed bits according to an exemplary embodiment. The method illustrated in FIG. 8 may be a failed bit repair processing procedure performed after Step S508 in FIG. 5A. The method illustrated in FIG. 8, for example, can be applied to the server side of the above system, and can also be applied to the terminal apparatus of the above system.

In Step S802, the redundancy is allocated by the redundancy allocation algorithm according to the positions of the failed bits in the respective unified segments and the standardized repair range, to obtain the standardized repair position as the repair positions of the redundancy in the respective unified segments. Any redundancy allocation algorithm that effectively allocates the redundancy to completely cover the positions of the failed bits can be used to output the position and result of the redundancy allocation. The result is whether the failed bit in the global segment can be successfully completely completed by the limited redundancy. If it is successful, it will be the valid global segment, otherwise, it will be the invalid global segment.

In Step S804, the repair positions on the redundancy in the respective unified segments are restored to the repair positions of the redundancy on the chip according to the standardized line width to repair the failed bits. When the line width is standardized according to bits, the standardized line width is obtained. For example, when standardized to 1, or 2, or 3 bits, the corresponding GR direction is reduced to 1/original GR line width, or 2/original GR Line width, or 2/original GR line width, LR direction is reduced to 1/original LR line width, or 2/original LR line width, or 2/original LR line width. When the repair position data is output at the end, the reduced position is zoomed in back to restore it.

Figure 9:
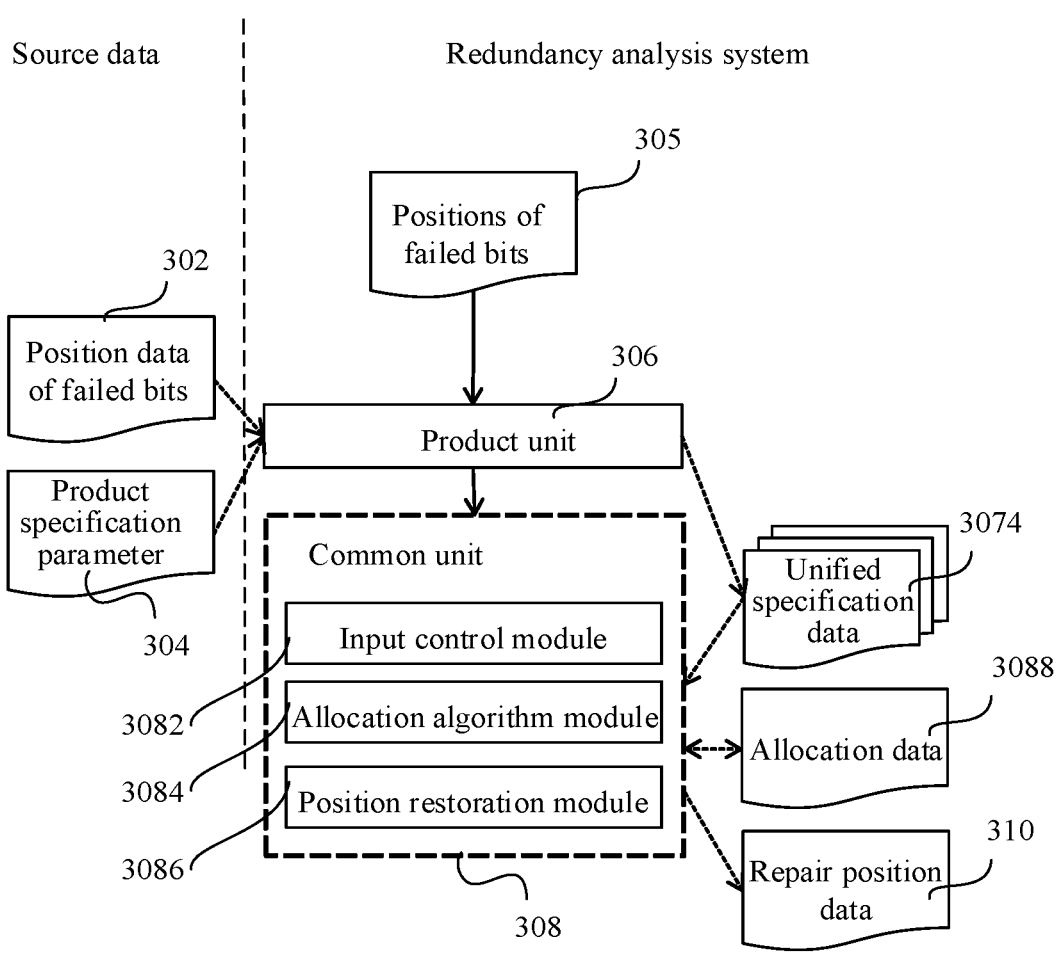
FIG. 9 illustrates a schematic diagram of data flow of another redundancy analysis system illustrated in FIG. 8.

FIG. 9 illustrates a schematic diagram of data flow of another redundancy analysis system illustrated in FIG. 8. The solid-line connected arrows in FIG. 9 indicate the processing procedure, and the dashed-line connected arrows indicate input/output.

With reference to FIG. 9, the reference numerals of the modules with the same meaning as those in FIG. 3 and FIG. 4A are the same, and will not be repeated here. As illustrated in FIG. 9, the common unit 308 can include an input control module 3082, which can be used to input a large number of unified specification data 3074 that has been divided into data. Furthermore, the GR and LR allocation processing procedure of any segment will not affect other segments. A segment individually enters the allocation algorithm module 3084 to perform the redundancy allocation processing. When each segment enters the allocation algorithm module 3084, additional auxiliary parameters can be given, such as the available number of GRs in the current global segment and LRs in the segment, and so on. In the allocation algorithm module 3084, any algorithm that can effectively allocate the redundancy to completely cover the positions of the failed bits is provided, and the position and result of the redundancy allocation are output, namely the allocation data 3088. The result is whether the failed bit in the global segment can be successfully and completely covered and repaired by a redundancy. If it is successful, it is a valid global segment otherwise it is an invalid global segment. The bank to which the invalid global segment belongs will also be designated as an invalid bank. The position restoration module 3086 restores the redundancy allocation repair position (standardized position) in the allocation data 3088 to the original position by using the scaling parameters provided in the unified specification data 3074, and outputs all the allocation repair original positions to the repair position data 310.

Figure 10:
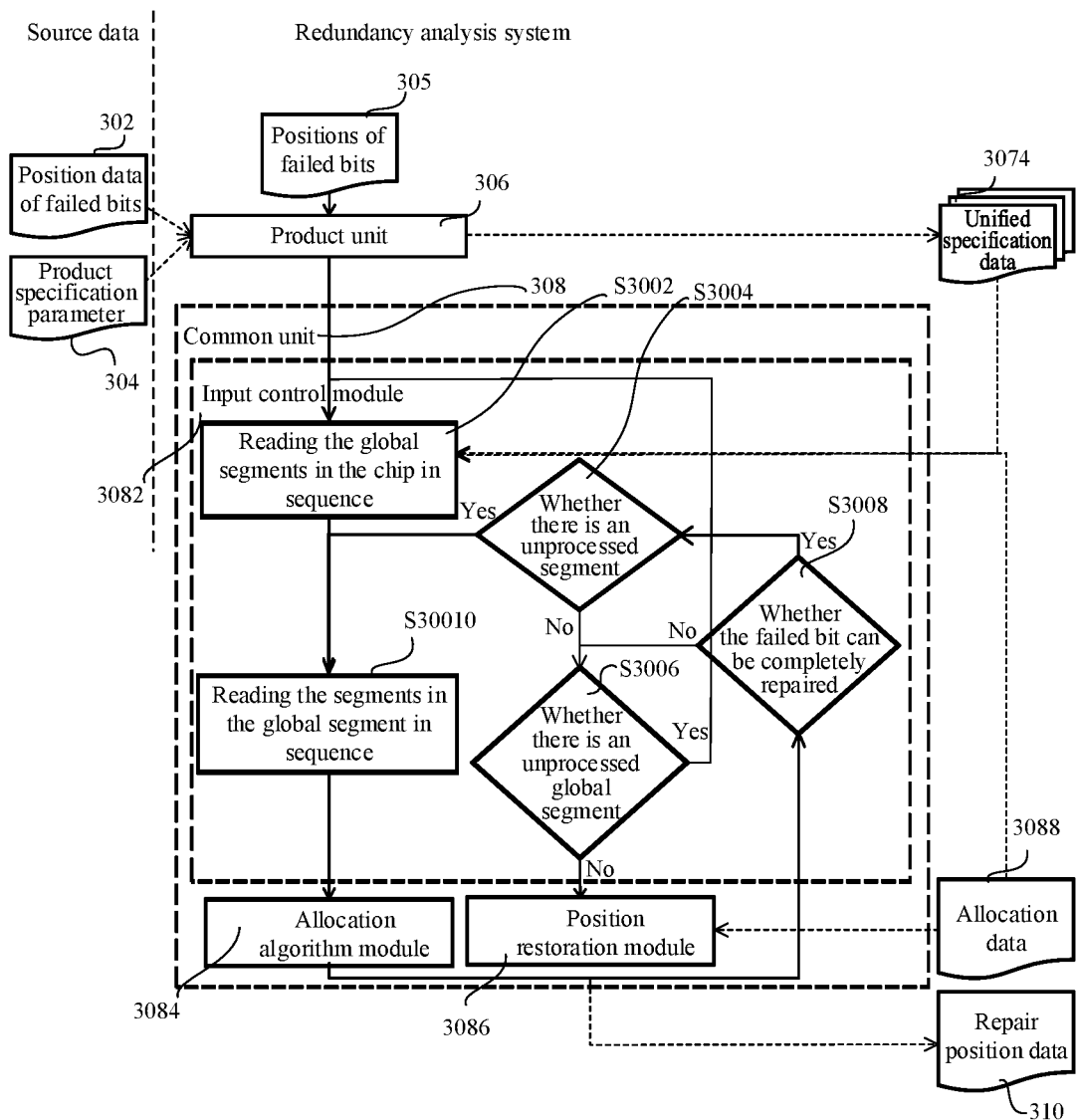
FIG. 10 illustrates a schematic diagram of data flow of another redundancy analysis system illustrated in FIG. 8 and FIG. 9.

FIG. 10 illustrates a schematic diagram of data flow of another redundancy analysis system illustrated in FIG. 8 and FIG. 9. The solid-line connected arrows indicate the processing procedure, and the dashed-line connected arrows indicate input/output in FIG. 10.

With reference to FIG. 10, the modules with the same meaning as those in FIG. 3, FIG. 4A and FIG. 9 have the same reference numerals, and will not be repeated here. As illustrated in FIG. 9, in the common unit 308, after the input control module 3082 receives the unified specification data 3074, it first reads the global segment in the chip in sequence (S3002), and then reads the segment in the global segment in sequence (S30010) before entering the allocation algorithm module 3084. When the allocation algorithm module 3084 allocates the redundancy, it judges whether the allocation result is that the failed bit in the segment can be successfully and completely covered and repaired by the limited redundancy (S3008). If so, it further judges whether the corresponding global segment exists an unprocessed segment (S3004), if there is an unprocessed segment, return to Step S30010 for reading, if there is no unprocessed segment, determine whether there is an unprocessed segment (S3006), if there is an unprocessed segment, return to step S3002 for reading, if there is no unprocessed global segment, enter the position restoration module 3086, restore the redundancy allocation repair position in the allocation data 3088 to the original position, and output all the allocation repair original positions to the repair position data 310.

Figure 11:
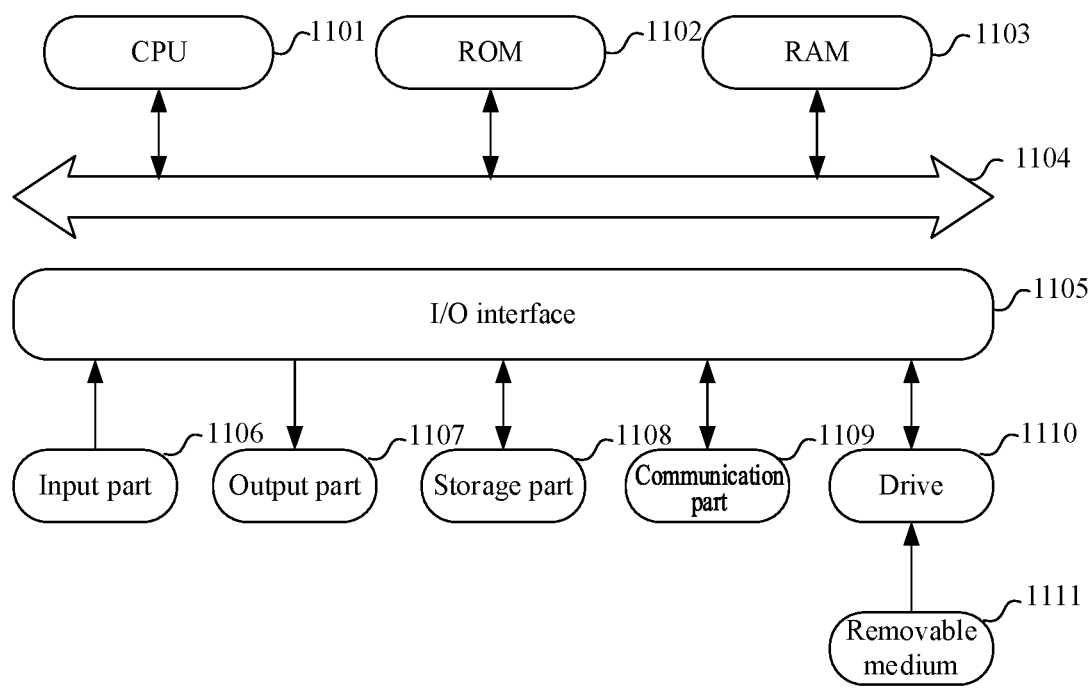
FIG. 11 shows a schematic structural diagram of an electronic apparatus in an embodiment of the present disclosure.

FIG. 11 shows a schematic structural diagram of an electronic apparatus in an embodiment of the present disclosure. The apparatus illustrated in FIG. 11 only uses a computer system as an example, and should not bring any limitation to the function and scope of use of the embodiments in the present disclosure.

As illustrated in FIG. 11, the apparatus 1100 includes a central processing unit (CPU) 1101, which can perform various appropriate actions and processing, based on a program stored in a Read-Only memory (ROM) 1102 or a program loaded from a storage part 1108 to a Random-Access Memory (RAM) 1103. In the RAM 1103, various programs and data required for the operation of the apparatus 1100 are also stored. The CPU 1101, the ROM 1102, and the RAM 1103 are connected to each other through a bus 1104. An input/output (I/O) interface 1105 is also connected to the bus 1104.

The following components are connected to the I/O interface 1105: input part 1106 including keyboard, mouse, etc.; output part 1107 including Cathode Ray Tube (CRT), Liquid Crystal Display (LCD), etc. and speakers, etc.; storage part 1108 including hard disk, etc.; and a communication part 1109 including a network interface card such as a LAN card, a modem, and the like. The communication part 1109 performs communication processing via a network such as the Internet. The drive 1110 is also connected to the I/O interface 1105 as needed. A removable medium 1111, such as a magnetic disk, an optical disk, a magneto-optical disk, a semiconductor memory, etc., is installed on the drive 1110 as needed, so that the computer program read therefrom is installed into the storage part 1108 as needed.

In particular, according to embodiments of the present disclosure, the process described above with reference to the flow chart can be implemented as a computer software program. For example, an embodiment of the present disclosure includes a computer program product, which includes a computer program carried on a computer-readable medium, and the computer program contains program code for executing the method illustrated in the flow chart. In such an embodiment, the computer program may be downloaded and installed from the network through the communication part 1109, and/or installed from the removable medium 1111. When the computer program is executed by the central processing unit (CPU) 1101, the above functions defined in the system of the present disclosure are executed.

It is to be noted that the computer-readable medium illustrated in the present disclosure may be a computer-readable signal medium or a computer-readable storage medium, or any combination of the two. The computer-readable storage medium may be, for example, but not limited to, an electrical, magnetic, optical, electromagnetic, infrared, or semiconductor system, device, or parts, or a combination of any of the above. More specific examples of computer-readable storage media may include, but are not limited to: electrical connections with one or more wires, portable computer disks, hard disks, Random Access Memory (RAM), Read-Only Memory (ROM), Erasable Programmable Read-Only Memory (EPROM or flash memory), optical fiber, Portable Compact Floppy Disk Read-Only Memory (CD-ROM), optical storage parts, magnetic storage parts, or any suitable combination of the above. In the present disclosure, a computer-readable storage medium may be any tangible medium that contains or stores a program, and the program may be used by or in combination with an instruction execution system, device, or parts. In the present disclosure, a computer-readable signal medium may include a data signal propagated in a baseband or as a part of a carrier wave, and a computer-readable program code is carried therein. This propagated data signal can take many forms, including but not limited to electromagnetic signals, optical signals, or any suitable combination of the above. The computer-readable signal medium may also be any computer-readable medium other than a computer-readable storage medium. The computer-readable medium may send, propagate, or transmit the program for use by or in combination with the instruction execution system, device, or parts. The program code contained on the computer-readable medium can be transmitted by any suitable medium, including but not limited to: wireless, wire, optical cable, RF, etc., or any suitable combination of the above.

The flow charts and block diagrams in the accompanying drawings illustrate the possible implementation architecture, functions, and operations of the system, method, and computer program product according to various embodiments of the present disclosure. In this regard, each block in the flow chart or block diagram can represent a module, program segment, or a part of code, and the above module, program segment, or the part of code contains one or more executable instructions for realizing the specified logic function. It should also be noted that, in some alternative implementations, the functions marked in the block may also occur in a different order from the order marked in the drawings. For example, two blocks illustrated in succession can actually be executed substantially in parallel, and they can sometimes be executed in the reverse order, depending on the functions involved. It should also be noted that each block in the block diagram or flow chart, and the combination of blocks in the block diagram or flow chart, can be implemented by a dedicated hardware-based system that performs the specified functions or operations, or can be implemented by a combination of dedicated hardware and computer instructions.

The modules involved in the described embodiments of the present disclosure can be implemented in software or hardware. The described module can also be provided in the processor, for example, it can be described as: a processor includes a parameter acquisition module, a specification conversion module, a circuit allocation module, and a position restoration module. Among them, the names of these modules do not constitute a limitation on the module itself under certain circumstances. For example, the parameter acquisition module can also be described as "a module that acquires chip parameters from a connected terminal".

As another aspect, the present disclosure also provides a computer-readable medium. The computer-readable medium may be included in the apparatus described in the above embodiments; or it may exist alone without being assembled into the apparatus. The above computer-readable medium carries one or more programs. When the above one or more programs are executed by an apparatus, the apparatus includes: acquiring a repair specification of redundancy of a chip where the failed bits are located; standardizing the repair specification of the redundancy to obtain a standardized repair specification; acquiring the positions of the failed bits on the chip; processing the positions of the failed bits on the chip according to the standardized repair specification to obtain standardized positions of the failed bits; allocating the redundancy by the redundancy allocation algorithm according to the standardized positions of the failed bits and the standardized repair specification to obtain standardized repair positions of the redundancy; and restoring the standardized repair positions of the redundancy to the repair positions of the redundancy on the chip according to the standardized repair specification to repair the failed bits.

The exemplary embodiments of the present disclosure have been specifically illustrated and described above. It is to be understood that the present disclosure is not limited to the detailed structure, arrangement or implementation method described herein; on the contrary, the present disclosure intends to cover various modifications and equivalent arrangements included in the spirit and scope of the appended claims.

What is claimed is:

1. A method for repairing a failed bit, comprising:
   acquiring a repair specification of a redundancy of a chip where the failed bit is located;
   standardizing the repair specification of the redundancy to obtain a standardized repair specification of the redundancy;
   acquiring a position of the failed bit on the chip;
   processing the position of the failed bit on the chip according to the standardized repair specification of the redundancy to obtain a standardized position of the failed bit;
   allocating the redundancy by a redundancy allocation algorithm according to the standardized position of the failed bit and the standardized repair specification of the redundancy to obtain a standardized repair position of the redundancy; and
   restoring the standardized repair position of the redundancy to a repair position of the redundancy on the chip according to the standardized repair specification of the redundancy to repair the failed bit;
   wherein the repair specification of the redundancy comprises a line width of the redundancy and a preset repair range of the redundancy;
   wherein the standardized repair specification of the redundancy comprises a standardized line width of the redundancy and a standardized repair range of the redundancy;
   wherein standardizing the repair specification of the redundancy to obtain the standardized repair specification of the redundancy comprises:
   standardizing the line width of the redundancy according to bit to obtain the standardized line width of the redundancy;
   dividing the chip into a plurality of unified segments according to the preset repair range to obtain a range of each of the unified segments; and
   standardizing the preset repair range according to the range of each of the unified segments to obtain the standardized repair range of the redundancy.

2. The method of claim 1, wherein processing the position of the failed bit on the chip according to the standardized repair specification of the redundancy to obtain the standardized position of the failed bit comprises:
   processing the position of the failed bit on the chip according to the standardized line width of the redundancy to obtain the standardized position of the failed bit as a position of the failed bit in a respective unified segment;
   allocating the redundancy by the redundancy allocation algorithm according to the standardized position of the failed bit and the standardized repair specification of the redundancy comprises:
   allocating the redundancy by the redundancy allocation algorithm according to the position of the failed bit in the respective unified segment and the standardized repair range of the redundancy, to obtain the standardized repair position as a repair position of the redundancy in the respective unified segment.

3. The method of claim 2, wherein restoring the standardized repair position of the redundancy to the repair position of the redundancy on the chip according to the standardized repair specification of the redundancy to repair the failed bit comprises:

restoring the repair position of the redundancy in the respective unified segment to the repair position of the redundancy on the chip according to the standardized line width of the redundancy to repair the failed bit.

4. The method of claim 1, wherein dividing the chip into the plurality of unified segments according to the preset repair range to obtain the range of each of the unified segments comprises:

obtaining a length of the range of each of the unified segments as a length of a corresponding preset repair range in an extension direction of the redundancy, or obtaining a width of the range of each of the unified segments as the length of the corresponding preset repair range in the extension direction of the redundancy.

5. The method of claim 4, wherein the redundancy comprises a Global Redundancy (GR) and a Local Redundancy (LR);

an extension direction of the GR is orthogonal to an extension direction of the LR;

the preset repair range comprises a global repair range and a local repair range, and the global repair range comprises a plurality of the local repair ranges;

the GR is configured to repair failed bits in the global repair range on the chip, and the LR is configured to repair failed bits in the local repair range on the chip;

the length of the range of each of the unified segments is the same as a length of a corresponding global repair range in the extension direction of the GR, and the width of the range of each of the unified segments is the same as a length of a corresponding local repair range in the extension direction of the LR.

6. The method of claim 5, wherein the standardized repair range of the redundancy comprises a standardized global repair range and a standardized local repair range;

standardizing the preset repair range according to the range of each of the unified segments to obtain the standardized repair range of the redundancy comprises:

obtaining the standardized global repair range as the range of a corresponding unified segment; and when the LR is used for co-location repair, standardizing a local repair range corresponding to the LR to obtain the standardized local repair range, wherein a length of the standardized local repair range in the extension direction of the GR is one data grid.

7. The method of claim 1, wherein processing the position of the failed bit on the chip according to the standardized repair specification of the redundancy to obtain the standardized position of the failed bit comprises:

scaling the position of the failed bit on the chip according to the line width of the redundancy and the standardized line width of the redundancy to obtain the standardized position of the failed bit.

8. The method of claim 7, wherein restoring the standardized repair position of the redundancy to the repair position of the redundancy on the chip according to the standardized repair specification of the redundancy to repair the failed bit comprises:

restoring the standardized repair position of the redundancy to the repair position of the redundancy on the chip according to the line width of the redundancy and the standardized line width of the redundancy to repair the failed bit.

9. A device for repairing a failed bit, comprising:

a parameter acquisition module, configured to acquire a repair specification of a redundancy of a chip where the failed bit is located, and acquire a position of the failed bit on the chip;

a specification conversion module, configured to standardize the repair specification of the redundancy to obtain a standardized repair specification of the redundancy, and process the position of the failed bit on the chip according to the standardized repair specification of the redundancy to obtain a standardized position of the failed bit;

a circuit allocation module, configured to allocate the redundancy by a redundancy allocation algorithm according to the standardized position of the failed bit and the standardized repair specification of the redundancy to obtain a standardized repair position of the redundancy; and a position restoration module, configured to restore the standardized repair position of the redundancy to a repair position of the redundancy on the chip according to the standardized repair specification of the redundancy to repair the failed bit;

wherein the repair specification of the redundancy comprises a line width of the redundancy and a preset repair range of the redundancy;

wherein the standardized repair specification of the redundancy comprises a standardized line width of the redundancy and a standardized repair range of the redundancy;

wherein the specification conversion module is configured to standardize the repair specification of the redundancy to obtain the standardized repair specification of the redundancy comprises the specification conversion module is configured to:

standardize the line width of the redundancy according to bit to obtain the standardized line width of the redundancy;

divide the chip into a plurality of unified segments according to the preset repair range to obtain a range of each of the unified segments; and standardize the preset repair range according to the range of each of the unified segments to obtain the standardized repair range of the redundancy.

10. An apparatus, comprising: a memory, a processor and executable instructions stored in the memory and executable in the processor, wherein the processor is configured to execute the instructions to implement:

acquiring a repair specification of a redundancy of a chip where a failed bit is located;

standardizing the repair specification of the redundancy to obtain a standardized repair specification of the redundancy;

acquiring a position of the failed bit on the chip;

processing the position of the failed bit on the chip according to the standardized repair specification of the redundancy to obtain a standardized position of the failed bit;

allocating the redundancy by a redundancy allocation algorithm according to the standardized position of the failed bit and the standardized repair specification of the redundancy to obtain a standardized repair position of the redundancy; and restoring the standardized repair position of the redundancy to a repair position of the redundancy on the chip according to the standardized repair specification of the redundancy to repair the failed bit;
wherein the repair specification of the redundancy comprises a line width of the redundancy and a preset repair range of the redundancy;
wherein the standardized repair specification of the redundancy comprises a standardized line width of the redundancy and a standardized repair range of the redundancy;
wherein standardizing the repair specification of the redundancy to obtain the standardized repair specification of the redundancy comprises:
standardizing the line width of the redundancy according to bit to obtain the standardized line width of the redundancy;
dividing the chip into a plurality of unified segments according to the preset repair range to obtain a range of each of the unified segments; and
standardizing the preset repair range according to the range of each of the unified segments to obtain the standardized repair range of the redundancy.

11. The apparatus of claim 10, wherein processing the position of the failed bit on the chip according to the standardized repair specification of the redundancy to obtain the standardized position of the failed bit comprises:
processing the position of the failed bit on the chip according to the standardized line width of the redundancy to obtain the standardized position of the failed bit as a position of the failed bit in a respective unified segment;
allocating the redundancy by the redundancy allocation algorithm according to the standardized position of the failed bit and the standardized repair specification of the redundancy comprises:
allocating the redundancy by the redundancy allocation algorithm according to the position of the failed bit in the respective unified segment and the standardized repair range of the redundancy, to obtain the standardized repair position as a repair position of the redundancy in the respective unified segment.

12. The apparatus of claim 11, wherein restoring the standardized repair position of the redundancy to the repair position of the redundancy on the chip according to the standardized repair specification of the redundancy to repair the failed bit comprises:
restoring the repair position of the redundancy in the respective unified segment to the repair position of the redundancy on the chip according to the standardized line width of the redundancy to repair the failed bit.

13. The apparatus of claim 10, wherein dividing the chip into the plurality of unified segments according to the preset repair range to obtain the range of each of the unified segments comprises:
obtaining a length of the range of each of the unified segments as a length of a corresponding preset repair range in an extension direction of the redundancy, or
obtaining a width of the range of each of the unified segments as the length of the corresponding preset repair range in the extension direction of the redundancy.

14. The apparatus of claim 13, wherein the redundancy comprises a Global Redundancy (GR) and a Local Redundancy (LR);
an extension direction of the GR is orthogonal to an extension direction of the LR;
the preset repair range comprises a global repair range and a local repair range, and the global repair range comprises a plurality of the local repair ranges;
the GR is configured to repair failed bits in the global repair range on the chip, and the LR is configured to repair failed bits in the local repair range on the chip;
the length of the range of each of the unified segments is the same as a length of a corresponding global repair range in the extension direction of the GR, and the width of the range of each of the unified segments is the same as a length of a corresponding local repair range in the extension direction of the LR.

15. The apparatus of claim 14, wherein the standardized repair range of the redundancy comprises a standardized global repair range and a standardized local repair range;
standardizing the preset repair range according to the range of each of the unified segments to obtain the standardized repair range of the redundancy comprises:
obtaining the standardized global repair range as the range of a corresponding unified segment; and
when the LR is used for co-location repair, standardizing a local repair range corresponding to the LR to obtain the standardized local repair range, wherein a length of the standardized local repair range in the extension direction of the GR is one data grid.

16. The apparatus of claim 10, wherein processing the position of the failed bit on the chip according to the standardized repair specification of the redundancy to obtain the standardized position of the failed bit comprises:
scaling the position of the failed bit on the chip according to the line width of the redundancy and the standardized line width of the redundancy to obtain the standardized position of the failed bit.

17. The apparatus of claim 16, wherein restoring the standardized repair position of the redundancy to the repair position of the redundancy on the chip according to the standardized repair specification of the redundancy to repair the failed bit comprises:
restoring the standardized repair position of the redundancy to the repair position of the redundancy on the chip according to the line width of the redundancy and the standardized line width of the redundancy to repair the failed bit.

* * * * *